United States Patent
Hiei

(10) Patent No.: US 9,553,509 B2
(45) Date of Patent: Jan. 24, 2017

(54) MULTICHANNEL DC-DC CONVERTER

(71) Applicant: Murata Manufacturing Co., Ltd., Nagaokakyo-shi, Kyoto-fu (JP)

(72) Inventor: Tomoyoshi Hiei, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 701 days.

(21) Appl. No.: 13/864,356

(22) Filed: Apr. 17, 2013

(65) Prior Publication Data
US 2013/0229167 A1 Sep. 5, 2013

Related U.S. Application Data

(63) Continuation of application No. PCT/JP2012/055183, filed on Mar. 1, 2012.

(30) Foreign Application Priority Data

Jun. 10, 2011 (JP) ................. 2011-130260

(51) Int. Cl.
*G05F 1/577* (2006.01)
*H02M 3/155* (2006.01)
(Continued)

(52) U.S. Cl.
CPC .......... *H02M 3/155* (2013.01); *H01L 23/5383* (2013.01); *H02M 1/44* (2013.01);
(Continued)

(58) Field of Classification Search
CPC .... H02M 7/003; H02M 3/1584; H02M 3/158; H02M 3/155; H02M 3/33561; H02M 3/156; H02M 3/1588; H02M 3/1582; H02M 2001/009; H02M 2001/0045; H02M 2001/0032; H02M 2001/0012
(Continued)

(56) References Cited

U.S. PATENT DOCUMENTS 7,427,910 B2 *  9/2008  Mehrotra ............ H01F 27/2804
                                                    336/200
7,554,430 B2 *  6/2009  Mehrotra ............ H01F 27/2804
                                                    336/200
(Continued)

FOREIGN PATENT DOCUMENTS

CN        1531093 A      9/2004
EP     2 106 014 A1      9/2009
(Continued)

OTHER PUBLICATIONS

Mu, X. et al., "Parasitic Parameters of Circuit Traces and their Effects on Conducted EMI in Switching Power Supply", Proceedings of the CSEE, vol. 24, No. 11, Nov. 2004.
(Continued)

*Primary Examiner* — Timothy J Dole
*Assistant Examiner* — Kevin H Sprenger
(74) *Attorney, Agent, or Firm* — Keating & Bennett, LLP

(57) ABSTRACT

In a multichannel DC-DC converter that reduces radiation noise to a minimum, a wiring line between the coil conductor of a channel having the smallest load current and the switching IC, among the coil conductors defining a plurality of channels, is the longest connection wiring line, such that a channel having the smallest load current is connected to a wiring line that is most likely to radiate noise and radiation noise is reduced to a minimum. A connection wiring line connected to a coil conductor having the largest load current among the plurality of coil conductors is the shortest connection wiring line. A channel having the largest load current is connected to a wiring line that is least likely to radiate noise and, as a result, radiation noise is further reduced.

15 Claims, 3 Drawing Sheets

(51) Int. Cl.
  *H02M 1/44* (2007.01)
  *H02M 3/158* (2006.01)
  *H01L 23/538* (2006.01)
  *H02M 7/00* (2006.01)
  *H02M 1/00* (2006.01)

(52) U.S. Cl.
  CPC ... *H02M 3/1584* (2013.01); *H01L 2924/0002* (2013.01); *H02M 7/003* (2013.01); *H02M 2001/009* (2013.01)

(58) Field of Classification Search
  USPC .............. 323/267–268, 271–272, 282–285
  See application file for complete search history.

(56) References Cited

U.S. PATENT DOCUMENTS

| | | | |
|---|---|---|---|
| 8,779,575 B2 * | 7/2014 | Shinohara | H01L 23/49531 257/666 |
| 2004/0179383 A1 | 9/2004 | Edo et al. | |
| 2009/0103272 A1 * | 4/2009 | Watanabe | H01F 27/292 361/748 |
| 2009/0201005 A1 | 8/2009 | Noma et al. | |
| 2009/0322296 A1 * | 12/2009 | Li | H02M 3/1584 323/282 |
| 2011/0101940 A1 | 5/2011 | Kudo | |
| 2011/0307910 A1 | 12/2011 | Nagasato et al. | |

FOREIGN PATENT DOCUMENTS

| | | |
|---|---|---|
| JP | 2004-343976 A | 12/2004 |
| JP | 2005-141719 A | 6/2005 |
| JP | 2006-340535 A | 12/2006 |
| JP | 2011-097755 A | 5/2011 |
| WO | 2008/087781 A1 | 7/2008 |
| WO | 2010/103910 A1 | 9/2010 |

OTHER PUBLICATIONS

Official Communication issued in International Patent Application No. PCT/JP2012/055183, mailed on Jun. 5, 2012.
Official Communication issued in corresponding European Patent Application No. 12797021.8, mailed on Sep. 1, 2015.

* cited by examiner

● END OF COIL ON MAIN SURFACE
⊘ VIA CONNECTED TO BOTTOM LAYER

MULTICHANNEL DC-DC CONVERTER

BACKGROUND OF THE INVENTION

1. Field of the Invention

The present invention relates to DC-DC converters in which switching elements are mounted, and particularly, to multichannel DC-DC converters.

2. Description of the Related Art

In the related art, DC-DC converters including a coil pattern disposed inside a magnetic substrate and a switching IC mounted on an upper portion of the magnetic substrate are known (for example, refer to International Publication No. 2008/087781).

In addition, multichannel DC-DC converters including a plurality of coils disposed inside a single magnetic substrate are also known (for example, refer to Japanese Unexamined Patent Application Publication No. 2004-343976).

In the above-described DC-DC converters, since the wiring lines between Vout terminals of a switching IC and coils are most likely to be affected by noise, it is preferable that the length of the wiring lines between the Vout terminals and the coils be as short as possible.

However, in general, the Vout terminals of a switching IC are concentrated in one location. In such a case, channels for which relatively long wiring lines are necessary, among wiring lines connected from Vout terminals of the switching IC to each of the coils, are inevitably provided on the upper surface of the magnetic substrate.

SUMMARY OF THE INVENTION

Preferred embodiments of the present invention provide a multichannel DC-DC converter in which the effects of noise are reduced to a minimum.

A multichannel DC-DC converter according to a preferred embodiment of the present invention includes a multilayer body, a plurality of coil conductors provided inside of the multilayer body, a plurality of land electrodes that are provided on a main surface of the multilayer body and that are electrically connected to the plurality of coil conductors via connection wiring lines, and a control IC that is connected to the plurality of land electrodes and that includes a plurality of input terminals or output terminals. In the multichannel DC-DC converter, the connection wiring line that is connected to the coil conductor having the smallest current among the plurality of coil conductors preferably has the longest connection wiring line.

Thus, the wiring line between the coil conductor of a channel having the smallest load current and the switching IC, among the coil conductors of a plurality of channels, is the longest wiring line, such that a channel having the least amount of noise is connected to a wiring line that is most likely to be affected by noise and the effects of noise are reduced to a minimum.

In addition, the connection wiring line connected to a coil conductor having the largest current among the plurality of coil conductors is preferably the shortest connection wiring line. In this case, a channel having the greatest amount of noise is connected to a wiring line that is least likely to be affected by noise, such that the effects of noise can be further reduced.

According to various preferred embodiments of the present invention, even when a switching IC is provided in which terminals are concentrated in one location, the effects of noise are reduced to a minimum.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
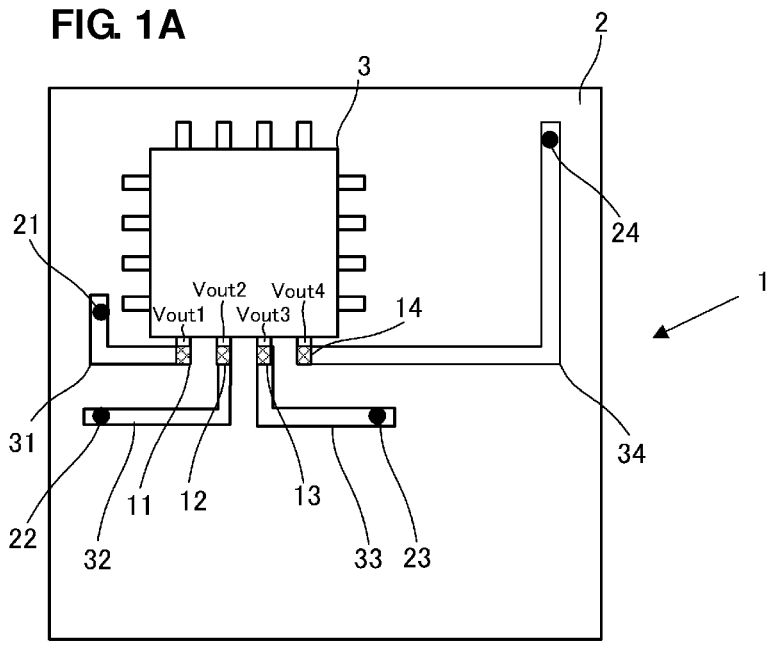
FIGS. 1A and 1B illustrate a top view and a cross-sectional view of a multichannel DC-DC converter according to a preferred embodiment of the present invention.
Figure 1B:
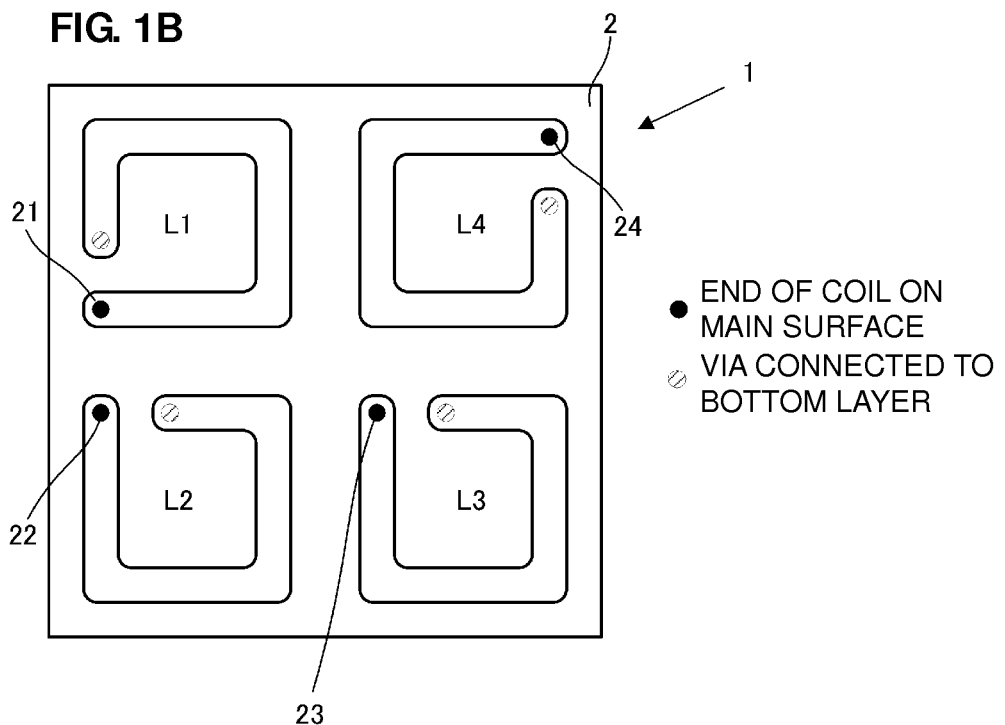

FIG. 1A is a top view of a multichannel DC-DC converter according to a preferred embodiment of the present invention, illustrating the main surface of multilayer body, and FIG. 1B is a cross-sectional view of a portion of the multilayer body in which coil conductors are provided.

Figure 2:
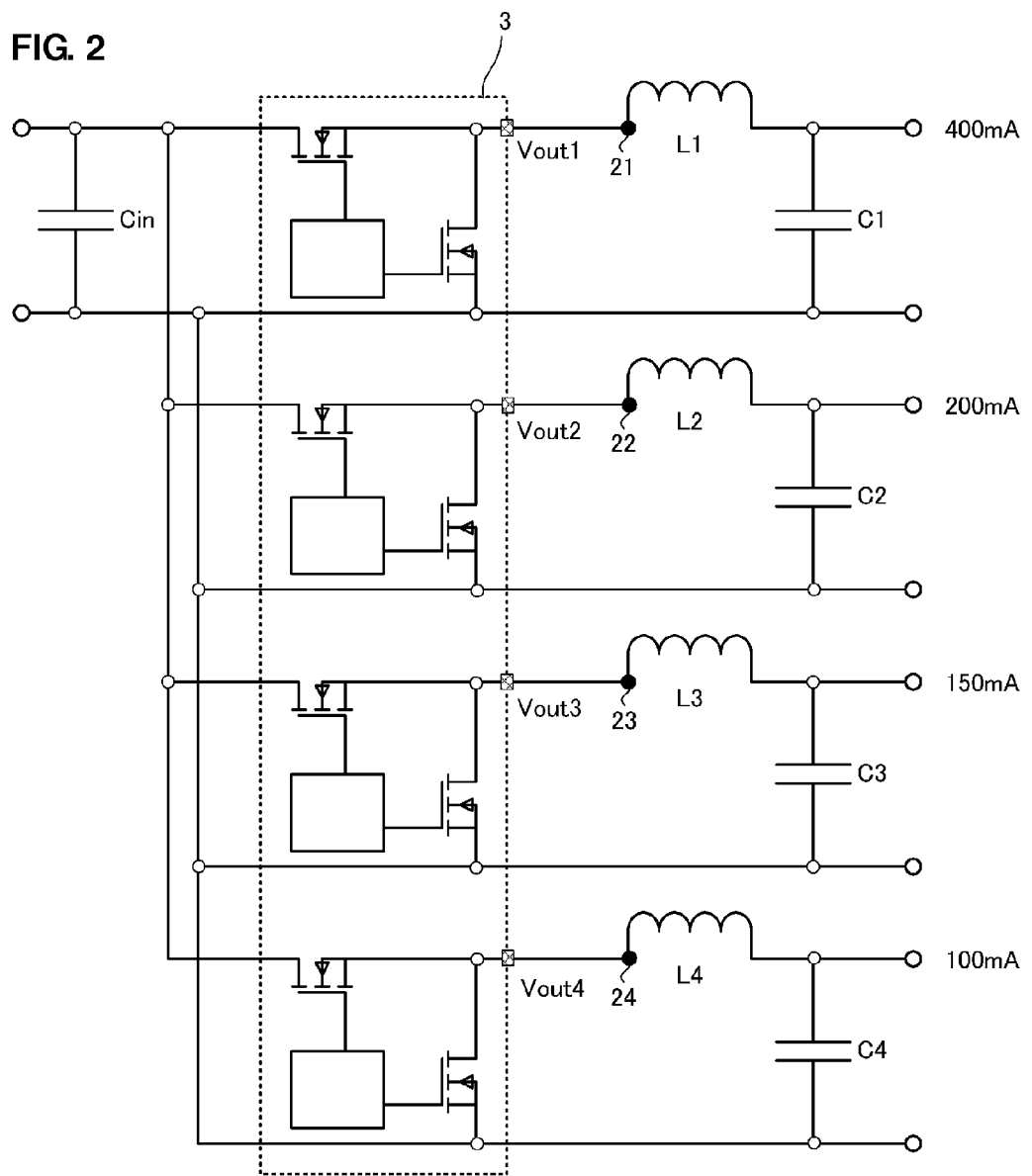
FIG. 2 is a circuit diagram for an example of a preferred embodiment of the present invention in which the multichannel DC-DC converter is a step-down DC-DC converter.
Figure 3:
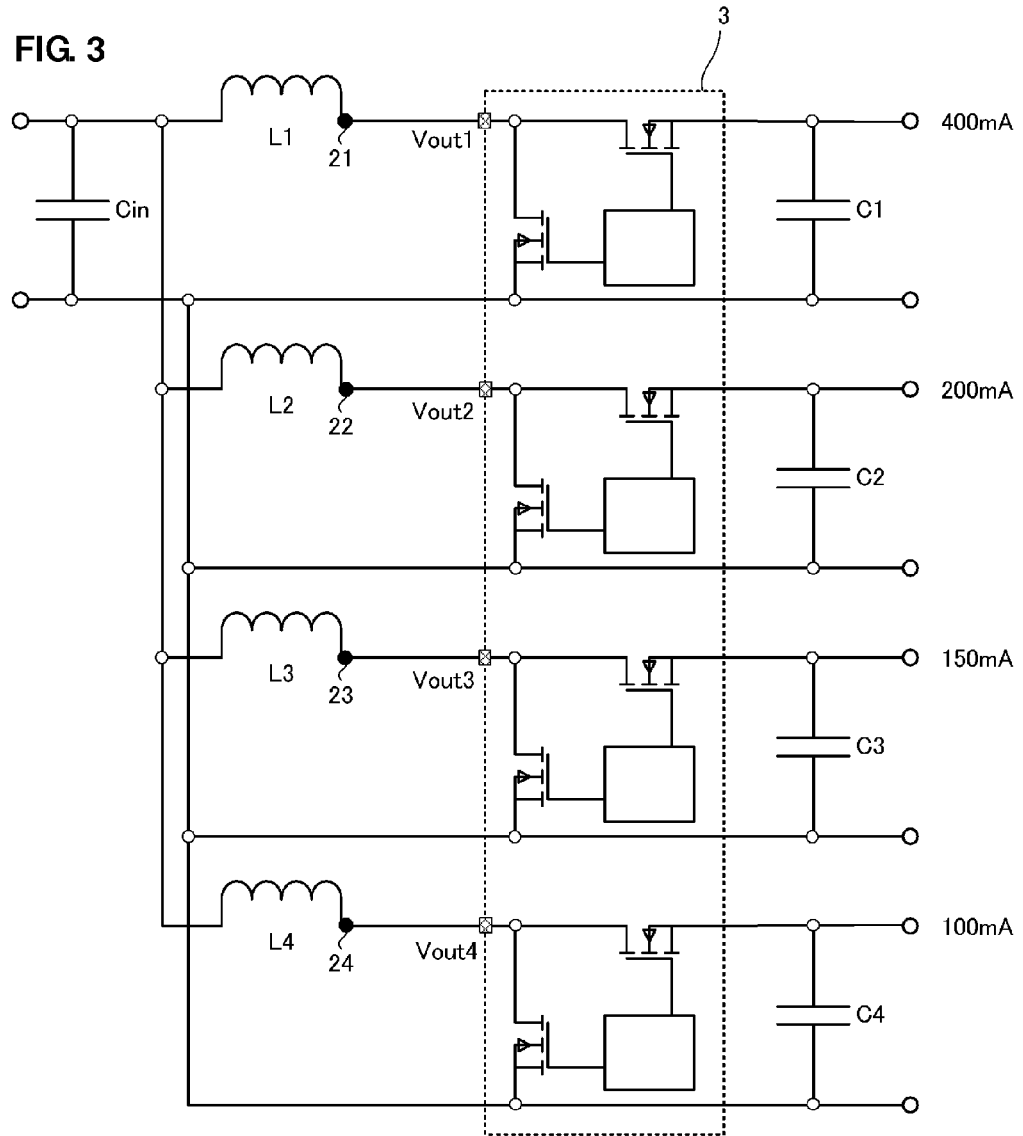
FIG. 3 is a circuit diagram for another example of a preferred embodiment of the present invention in which the multichannel DC-DC converter is a step-up DC-DC converter.

FIG. 2 is a circuit diagram for the case in which the multichannel DC-DC converter of the present preferred embodiment preferably is a step-down DC-DC converter, and FIG. 3 is a circuit diagram for the case where the multichannel DC-DC converter of the present preferred embodiment preferably is a step-up DC-DC converter, for example.

As illustrated in FIGS. 1A and 1B, in a multichannel DC-DC converter 1 of the present preferred embodiment, electronic components, such as a switching IC 3 and capacitors (not illustrated in FIGS. 1A and 1B) are mounted on the uppermost surface of a multilayer body 2, which includes a plurality of ceramic green sheets that are stacked on top of one another. The multilayer body 2 includes magnetic (ferrite) layers and, for example, coil conductors disposed between stacked sheets, the coil conductors being connected to one another in the stacking direction to define inductors. In this manner, a DC-DC converter is provided that utilizes the inductors as choke coils.

As illustrated in FIG. 1B, a plurality of coil conductors are provided in the multilayer body 2 of the present preferred embodiment. By connecting switching elements driven at different duties to the plurality of coil conductors, different output voltages can be obtained. The multichannel DC-DC converter 1 of the present preferred embodiment is preferably a four-channel DC-DC converter provided with a coil conductor L1, a coil conductor L2, a coil conductor L3, and a coil conductor L4, for example.

On the uppermost surface of the multilayer body 2, a land electrode 11, a land electrode 12, a land electrode 13 and a land electrode 14, to which the switching IC 3 is connected, are provided. In addition, a connection wiring line 31, a connection wiring line 32, a connection wiring line 33 and a connection wiring line 34, which are respectively connected to a main-surface-side end portion 21 of the coil conductor L1, a main-surface-side end portion 22 of the coil conductor L2, a main-surface-side end portion 23 of the coil conductor L3 and a main-surface-side end portion 24 of the coil conductor L4, are provided on the uppermost surface of the multilayer body 2.

The switching IC 3 preferably has a square or substantially square shape when viewed in plan and terminals protrude from the four sides thereof. Four switching elements are integrated into the inside of the switching IC 3 and four switching node terminals (Vout terminals) protrude from one side of the switching IC 3. These four Vout terminals are respectively connected to the land electrode 11, the land electrode 12, the land electrode 13 and the land electrode 14, and are respectively connected to the coil conductor L1, the coil conductor L2, the coil conductor L3 and the coil conductor L4 via the connection wiring line 31, the connection wiring line 32, the connection wiring line 33 and the connection wiring line 34.

As illustrated in FIG. 2, in the case of a step-down DC-DC converter, the Vout terminals (Vout1, Vout2, Vout3 and Vout4) are respectively connected to input sides of the coil conductor L1, the coil conductor L2, the coil conductor L3 and the coil conductor L4. As illustrated in FIG. 3, in the case of a step-up DC-DC converter, the Vout terminals (Vout1, Vout2, Vout3 and Vout4) are respectively connected to the output sides of the coil conductor L1, the coil conductor L2, the coil conductor L3 and the coil conductor L4, and therefore, the Vout terminals define input terminals.

Since capacitors and other components are mounted on the uppermost surface of the multilayer body 2, the switching IC 3 is mounted at a position that is shifted from the center of the uppermost surface of the multilayer body 2. In the present preferred embodiment, the switching IC 3 is preferably mounted at a position at the top left of the figure in FIG. 1A. With a DC-DC converter having such a switching scheme, since signals onto which switching noise has been maximally superimposed flow through the wiring lines between the Vout terminals of the switching IC 3 and the coil conductors, radiation noise is likely to be large. Consequently, the connection wiring lines are preferably as short as possible. However, since the switching IC 3 is mounted at a position shifted from the center of the main surface and the Vout terminals are concentrated on a single side of the switching IC 3, the distances between the Vout terminals (Vout1, Vout2, Vout3 and Vout4) and the main-surface-side end portions of the coil conductors are different from one another and the lengths of the connection wiring line 31, the connection wiring line 32, the connection wiring line 33 and the connection wiring line 34 are different from one another.

Consequently, the multichannel DC-DC converter 1 of the present preferred embodiment is configured so as to reduce radiation of noise to a minimum by configuring the connection wiring line of a channel having the smallest load current so as to be the longest connection wiring line.

The positional relationship between the constituent elements will be described with reference to FIG. 1A and FIG. 1B. The switching IC 3 is preferably mounted at a position in the top left of the multilayer body 2 as shown in FIG. 1A and the Vout terminals of the switching IC 3 are arranged adjacent to the center of the multilayer body 2. The Vout terminals are arranged in the order of Vout1, Vout2, Vout3 and Vout4 from the left side of the multilayer body 2 as shown in FIG. 1B. The coil conductor L1 is arranged at the top left of the multilayer body 2 as shown in FIG. 1B, and the main-surface-side end portion 21 is arranged at the bottom left of the coil conductor L1 in FIG. 1B. The coil conductor L2 is arranged at the bottom left of the multilayer body 2 as shown in FIG. 1B, and the main-surface-side end portion 22 is arranged at the top left of the coil conductor L2 in FIG. 1B. The coil conductor L3 is arranged at the bottom right of the multilayer body 2 as shown in FIG. 1A, and the main-surface-side end portion 23 is arranged at the top left of the coil conductor L3 in FIG. 1B. The coil conductor L4 is arranged at the top right of the multilayer body 2 as shown in FIG. 1A, and the main-surface-side end portion 24 is arranged at the top right of the coil conductor L4 in FIG. 1B.

Therefore, on the uppermost surface of the multilayer body 2 as shown in FIG. 1B, the main-surface-side end portion 21 of the coil conductor L1 is arranged slightly above the center and on the left side, the main-surface-side end portion 22 of the coil conductor L2 is arranged slightly below the center and on left side, the main-surface-side end portion 23 of the coil conductor L3 is arranged slightly below and to the right of the center and the main-surface-side end portion 24 of the coil conductor L4 is arranged at the top right.

Consequently, the main-surface-side end portion 21 is closest to the corresponding Vout terminal and the main-surface-side end portion 24 is farthest away from the corresponding Vout terminal. Therefore, among the Vout terminals, the connection wiring line 31, which connects Vout1 arranged on the leftmost side and the main-surface-side end portion 21, is the shortest connection wiring line and the connection wiring line 34, which connects Vout4 and the main-surface-side end portion 24, is the longest connection wiring line.

Consequently, the coil conductor L1, which has the largest load current, is connected to the Vout1 channel and the coil conductor L4, which has the smallest load current, is connected to the Vout4 channel. In the present preferred embodiment, the load current of the coil conductor L1 is preferably about 400 mA, for example, the load current of the coil conductor L2 is preferably about 200 mA, for example, the load current of the coil conductor L3 is preferably about 150 mA, for example, and the load current of the coil conductor L4 is preferably about 100 mA, for example.

Thus, by configuring the connection wiring line 34 between the coil conductor L4 of the channel having the smallest load current, among the coil conductors defining a plurality of channels, and the Vout terminal (Vout4) of the switching IC 3 so as to be the longest connection wiring line, the channel having the smallest load current is connected to the wiring line which is most likely to radiate noise, such that radiation noise is reduced to a minimum.

In addition, the connection wiring line 31 between the coil conductor L1, which has the largest load current among the coil conductors forming the plurality of channels, and the Vout terminal (Vout1) of the switching IC 3 is the shortest connection wiring line, such that the channel having the largest load current is connected to the wiring line that is least likely to radiate noise, such that radiation noise is further reduced.

The multichannel DC-DC converter of the present preferred embodiment preferably includes four channels and, therefore, includes the coil conductor L2 preferably having a load current of about 200 mA, for example, and the coil conductor L3 preferably having a load current of about 150 mA, for example. In the present preferred embodiment, the length of the connection wiring line 32 between the coil conductor L2 and the Vout terminal (Vout2) of the switching IC 3 and the length of the connection wiring line 33 between the coil conductor L3 and the Vout terminal (Vout3) of the switching IC 3 are substantially the same, but it is preferable that the length of the connection wiring line 32 of the coil conductor L2 for which the load current is larger be shorter than the length of the connection wiring line 33. However, in preferred embodiments of the present invention, it is important to use the channel having the smallest load current with the connection wiring line 34 which is most likely to radiate noise, but, for the other channels, it is not essential to use wiring lines whose lengths increase in order of the smaller to larger load currents of the channels with which they are used.

In the case in which a DC-DC converter includes more channels, radiation noise can be reduced to a minimum by configuring the connection wiring line between the coil conductor of a channel having the smallest load current and the Vout terminal of the switching IC so as to be the longest connection wiring line, as in the wiring line connection relationship described in the present preferred embodiment. In addition, radiation noise can be further reduced by configuring the connection wiring line between the coil conductor having the largest load current and the Vout terminal of the switching IC so as to be the shortest connection wiring line.

In addition, in the multichannel DC-DC converter of the present preferred embodiment, preferably, the main-surface-side end portion 21 is disposed closest to the corresponding Vout terminal and the main-surface-side end portion 24 is disposed furthest away from the corresponding Vout terminal. However, for example, in a case in which the main-surface-side end portion 24 is arranged close to the center of the multilayer body 2, the main-surface-side end portion 24 would be disposed closest to the corresponding Vout terminal. In this case, the channel having the largest load current may preferably be connected to the longest connection wiring line (for example, the connection wiring line 33). In addition, in this case, the connection wiring line 34 is the shortest connection wiring line and, therefore, the channel having the largest load current may be connected to the connection wiring line 34.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multichannel DC-DC converter comprising:
   a multilayer body;
   a plurality of coil conductors provided in the multilayer body;
   a plurality of land electrodes provided on a main surface of the multilayer body and being electrically connected to the plurality of coil conductors via a plurality of connection wiring lines; and
   a control IC connected to the plurality of land electrodes and including a plurality of input terminals or output terminals; wherein
   a first connection wiring line of the plurality of connection wiring lines, that is connected to a first coil conductor having a smallest load current among the plurality of coil conductors, is a longest connection wiring line.

2. The multichannel DC-DC converter according to claim 1, wherein a second connection wiring line of the plurality of connection wiring lines that is connected to a second coil conductor having a largest load current among the plurality of coil conductors is a shortest connection wiring line.

3. The multichannel DC-DC converter according to claim 1, wherein the control IC is a switching IC.

4. The multichannel DC-DC converter according to claim 1, wherein the multilayer body includes a plurality of magnetic layers that are stacked on one another.

5. The multichannel DC-DC converter according to claim 1, wherein the plurality of coil conductors includes four coil conductors.

6. The multichannel DC-DC converter according to claim 2, wherein remaining ones of the plurality of connection wiring lines other than the first and second connection wiring lines have substantially the same length.

7. The multichannel DC-DC converter according to claim 1, wherein each of the plurality of coil conductors defines a choke coil.

8. The multichannel DC-DC converter according to claim 3, wherein a center of the control IC is spaced away from a center of the multilayer body.

9. The multichannel DC-DC converter according to claim 1, wherein each of the plurality of input terminals or output terminals is disposed along a common side of the control IC.

10. The multichannel DC-DC converter according to claim 1, wherein the control IC has a square or substantially square shape and each of four sides of the control IC includes at least one of the input terminals or the output terminals.

11. The multichannel DC-DC converter according to claim 1, wherein the plurality of input terminal or output terminals are a plurality of input terminals connected to input sides of the plurality of coil conductors.

12. The multichannel DC-DC converter according to claim 1, wherein the plurality of input terminal or output terminals are a plurality of output terminals connected to output sides of the plurality of coil conductors.

13. The multichannel DC-DC converter according to claim 1, further comprising at least one capacitor disposed on the main surface of the multilayer body.

14. The multichannel DC-DC converter according to claim 1, wherein the first coil conductor has a current load of about 400 mA.

15. The multichannel DC-DC converter according to claim 2, wherein the second coil conductor has a current load of about 100 mA.

* * * * *